United States Patent
Truskett et al.

(10) Patent No.: US 9,337,591 B2
(45) Date of Patent: May 10, 2016

(54) APPARATUS FOR TRANSMISSION TESTING OF A TELECOMMUNICATIONS JACK

(75) Inventors: Kevin James Truskett, Kincumber (AU); Kristian Darrell Stewart, Saratoga (AU)

(73) Assignee: CommScope Technologies LLC, Hickory, NC (US)

( * ) Notice: Subject to any disclaimer, the term of this patent is extended or adjusted under 35 U.S.C. 154(b) by 564 days.

(21) Appl. No.: 13/524,448

(22) Filed: Jun. 15, 2012

(65) Prior Publication Data

US 2012/0326741 A1 Dec. 27, 2012

(30) Foreign Application Priority Data

Jun. 21, 2011 (AU) ................................ 2011202975

(51) Int. Cl.
*H01R 24/64* (2011.01)
*G01R 31/04* (2006.01)
*H01R 13/625* (2006.01)
*H01R 4/24* (2006.01)
*H01R 13/24* (2006.01)

(52) U.S. Cl.
CPC .............. *H01R 24/64* (2013.01); *G01R 31/045* (2013.01); *H01R 13/625* (2013.01); *H01R 4/2416* (2013.01); *H01R 13/2442* (2013.01); *H01R 2201/20* (2013.01)

(58) Field of Classification Search
None
See application file for complete search history.

(56) References Cited

U.S. PATENT DOCUMENTS

| | | | | |
|---|---|---|---|---|
| 3,767,917 A | * | 10/1973 | Lampart et al. | 250/384 |
| 4,626,633 A | * | 12/1986 | Ruehl et al. | 379/27.08 |
| 4,734,651 A | | 3/1988 | Keller et al. | |
| 4,959,609 A | * | 9/1990 | Prokopp et al. | 324/537 |
| 5,247,259 A | | 9/1993 | Miller et al. | |
| 6,019,612 A | * | 2/2000 | Hasegawa et al. | 439/73 |
| 6,089,894 A | | 7/2000 | Fletcher | |
| 6,293,815 B1 | | 9/2001 | Daoud | |
| 6,731,118 B2 | * | 5/2004 | Nishino et al. | 324/538 |
| 2007/0036489 A1 | | 2/2007 | Grzegorzewska et al. | |
| 2007/0238367 A1 | * | 10/2007 | Hammond et al. | 439/676 |
| 2010/0311260 A1 | * | 12/2010 | Knudsen et al. | 439/148 |

FOREIGN PATENT DOCUMENTS

DE 42 24 240 1/1993

OTHER PUBLICATIONS

European Search Report for EP Application No. 12171971.0 mailed Jul. 4, 2014 (7 pages).

* cited by examiner

*Primary Examiner* — Benjamin M Baldridge
*Assistant Examiner* — Courtney McDonnough
(74) *Attorney, Agent, or Firm* — Merchant & Gould P.C.

(57) ABSTRACT

Apparatus (10) for transmission testing of a telecommunications jack (100) having a plurality of insulation displacement contacts (IDCs) (103), the apparatus (10) including: a base (30); a plurality of transmission test probes (31) associated with the base (30); and a jack holder (20) for removably coupling the jack (100) to the base (30) such that IDCs (103) of the jack (100) are in electrical communication with corresponding test probes (31); wherein the jack holder (20) is fixed relative to the base (30) during testing, such that the jack (100) remains stationary with respect to the probes (31).

17 Claims, 4 Drawing Sheets

APPARATUS FOR TRANSMISSION TESTING OF A TELECOMMUNICATIONS JACK

This application claims benefit of Serial No. 2011202975, filed 21 Jun. 2011 in Australia and which application is incorporated herein by reference. To the extent appropriate, a claim of priority is made to each of the above disclosed application.

TECHNICAL FIELD OF THE INVENTION

The present invention relates to an apparatus for transmission testing of a telecommunications jack having a plurality of insulation displacement contacts (IDCs), and to a method of positioning such a telecommunications jack for transmission testing.

BACKGROUND OF THE INVENTION

To ensure that they meet performance requirements, telecommunications networks require testing of their physical components, including connecting hardware such as fixed connectors (jacks). Testing protocols such as those set out in the ANSI/TIA/EIA 568.B and 568.C standards require that twisted-pair cabling used in such networks meet optimum thresholds of certain field-test parameters including insertion loss, near-end crosstalk (NEXT) loss, far-end crosstalk (FEXT), return loss and propagation delay. Connecting hardware used with twisted-pair cabling must meet corresponding Connecting Hardware Transmission Performance standards.

In order to perform the above-mentioned tests, a test plug connected to field-test equipment is mated to the connecting hardware. The connecting hardware requires suitable far end termination in order to complete the test setup. In the case of jacks for 8 position 8 contact (8P8C) connectors, generally referred to as "RJ45 jacks", this requires terminating physical wires (which are in electrical communication with a printed circuit board) onto the Insulation Displacement Contacts (IDCs) of the jacks. Termination of wires is typically time-consuming and labour-intensive. In addition, the wires have an inherent variability in their length, number of twists, and proximity to each other, all of which can adversely affect the reliability of the testing method.

It would be desirable to overcome or alleviate the above mentioned difficulties, or at least provide a useful alternative.

SUMMARY OF THE INVENTION

In accordance with one aspect of the invention, there is provided an apparatus for transmission testing of a telecommunications jack having a plurality of insulation displacement contacts (IDCs), the apparatus including:
 a base;
 a plurality of transmission test probes associated with the base; and
 a jack holder for removably coupling the jack to the base such that IDCs of the jack are in electrical communication with corresponding test probes;
 wherein the jack holder is fixed relative to the base during testing, such that the jack remains stationary with respect to the probes.

The invention thus provides a fixed structure to which jacks can be mounted during testing, and removed after testing is complete. The jack is thus retained and kept aligned during the testing procedure, thereby ensuring that a repeatable outcome can be obtained.

The apparatus of the invention may be used repeatedly, by way of contrast to the wire-termination method in which the wires must be thrown away after testing. In addition, since the same apparatus can be used multiple times, the inherent variability in length, number of twists, and proximity of adjacent wires can be avoided or greatly reduced, thus greatly enhancing the reliability of the testing procedure.

Providing an apparatus to which jacks can be simply mounted and demounted also saves greatly on time since the time-consuming step of terminating wires onto the IDCs is not required. Advantageously, this allows for online testing of jacks during high-speed manufacture—a facility which is not available with known testing methods and apparatus.

Replacement of wires with direct probes as provided herein may also provide the benefit of shorter far end termination length.

In a particularly preferred embodiment, the jack holder is formed separately from the base. This enables the jack to be mounted prior to bringing the IDCs into contact with the probes.

Preferably, the base includes one or more guides for aligning the jack holder with the base and the test probes.

In one embodiment, the base includes a cavity to receive a printed circuit board which is in electrical communication with the test probes.

The apparatus preferably includes a locking mechanism for holding the jack holder fixed relative to the base. This may be in the form of a clip which is releasably attachable to the jack holder and to the base. The clip may include one or more tongues shaped to engage with corresponding brackets in or on the base. Preferably, the clip includes a plate having a lower surface, and the jack holder includes one or more shoulders, wherein the plate is rotatable to bring the lower surface into engagement with the shoulders of the jack such that the jack remains stationary with respect to the probes. In this embodiment, the locking mechanism is a simple cam lock which can be released by rotation of the clip, whereby the jack holder is released from the base in order to, in turn, remove the jack.

The jack holder may include at least one groove shaped to slidingly receive a ridge on an external surface of the jack, thereby to retain the jack.

Preferably, each probe has a contact portion which is bent at an angle to a non-contact portion of the probe. The angle is preferably 45 degrees or less.

In a second aspect, the present invention provides a method of positioning a telecommunications jack for transmission testing, the jack including a plurality of insulation displacement contacts (IDCs), the method including:
 providing an apparatus including a base including a plurality of transmission test probes, and a jack holder which is configured to removably retain the jack;
 inserting the jack into the jack holder; bringing the probes into contact with the IDCs; and
 holding the jack stationary with respect to the probes.

The jack holder is preferably formed separately from the base, and if so, the probes may be brought into contact with the IDCs after the jack is inserted into the jack holder.

The method preferably further includes the step of locking the jack holder to the base, whereby the jack is held stationary with respect to the probes.

In preferred embodiments, the base and/or the jack holder are constructed of non conductive materials. This assists in avoiding spurious errors or interference during the transmission testing procedure.

BRIEF DESCRIPTION OF THE DRAWINGS

Preferred embodiments of the present invention are hereafter described, by way of non-limiting example only, with reference to the accompanying drawings in which.

DETAILED DESCRIPTION OF PREFERRED EMBODIMENTS OF THE INVENTION

Referring to the Figures, there is shown an exemplary apparatus, generally indicated by 10, for transmission testing of a telecommunications jack 100 having a plurality of insulation displacement contacts (IDCs) which are housed in IDC towers 101.

Figure 1:
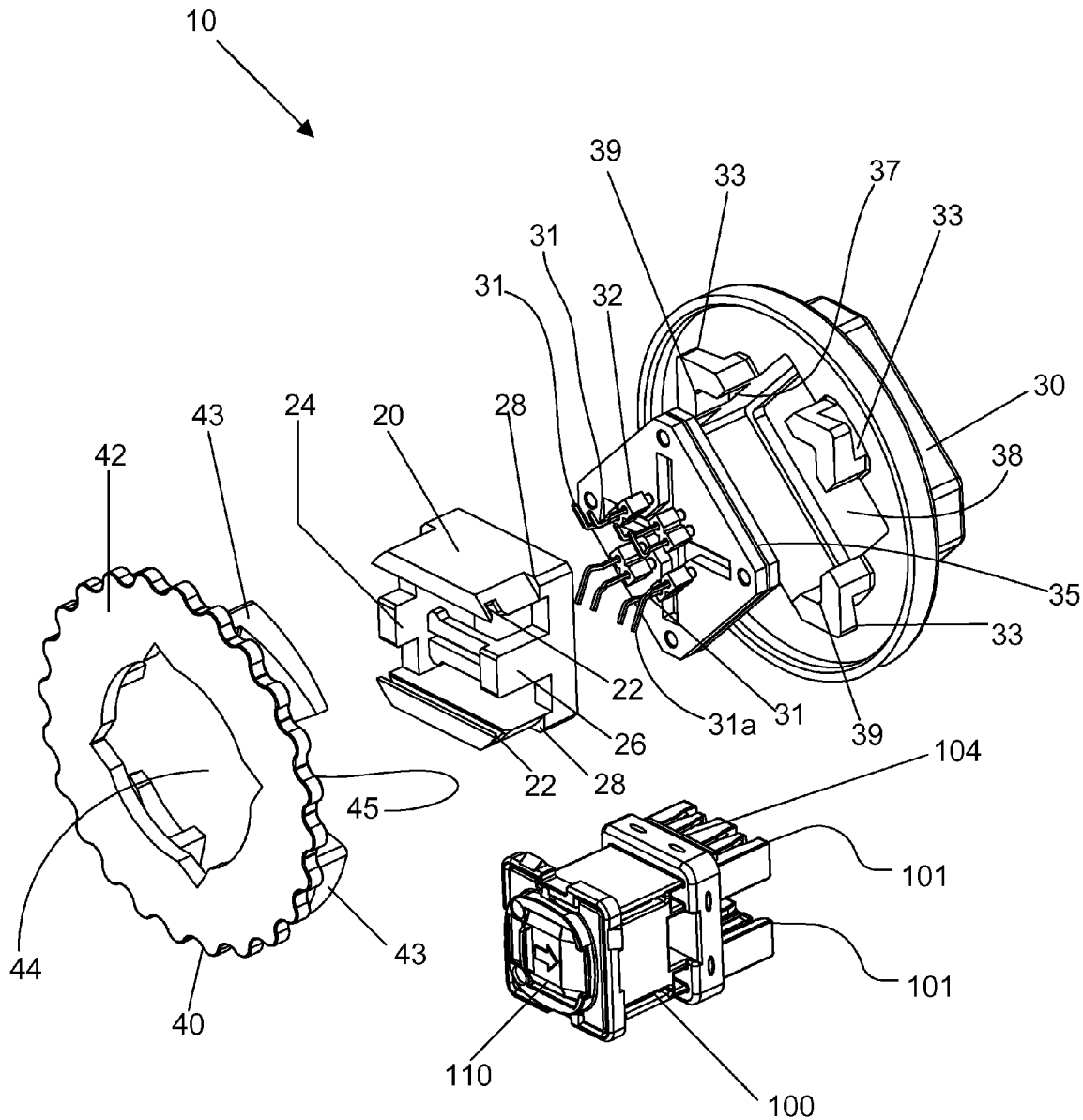
FIG. 1 is an exploded view of one example of a testing apparatus according to the invention.
Figure 4:
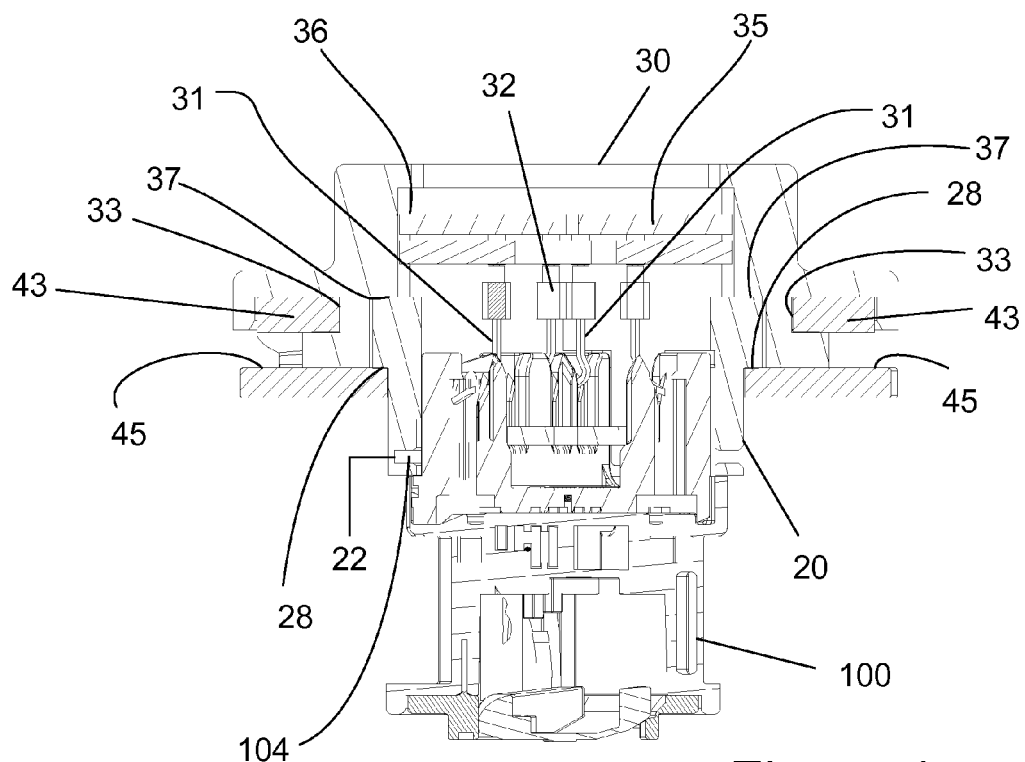
FIG. 4 is a section through the line 4-4 of FIG. 3.

The apparatus 10 includes a jack holder 20, which in this example is formed as a separate component. The jack holder 20 is configured to removably retain the jack 100 by virtue of opposed grooves 22 which are shaped to receive corresponding one or more ridges 104 formed on external surfaces of the jack 100, as shown in FIGS. 1 and 4.

Figure 2:
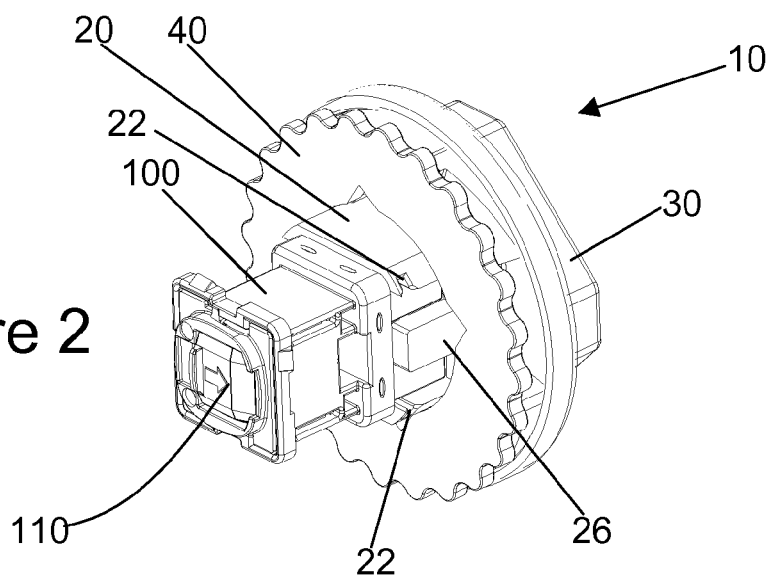
FIG. 2 shows the testing apparatus of FIG. 1 in assembled form, with a telecommunications jack mounted to the testing apparatus.
Figure 3:
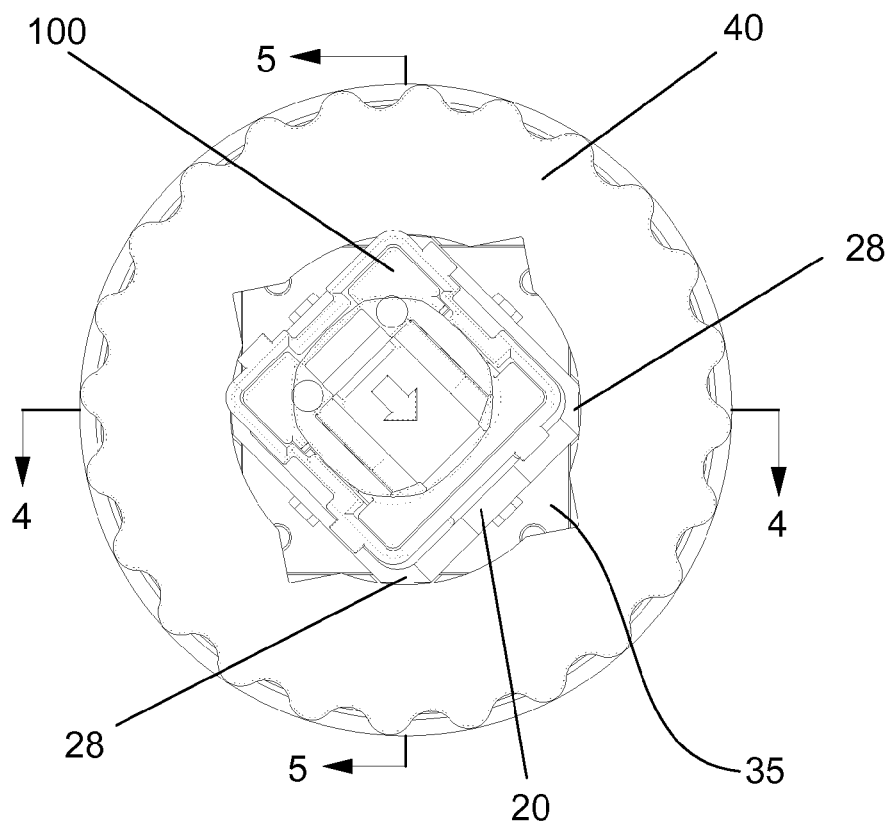
FIG. 3 is a top plan view of the testing apparatus and jack shown in FIG. 2.
Figure 5:
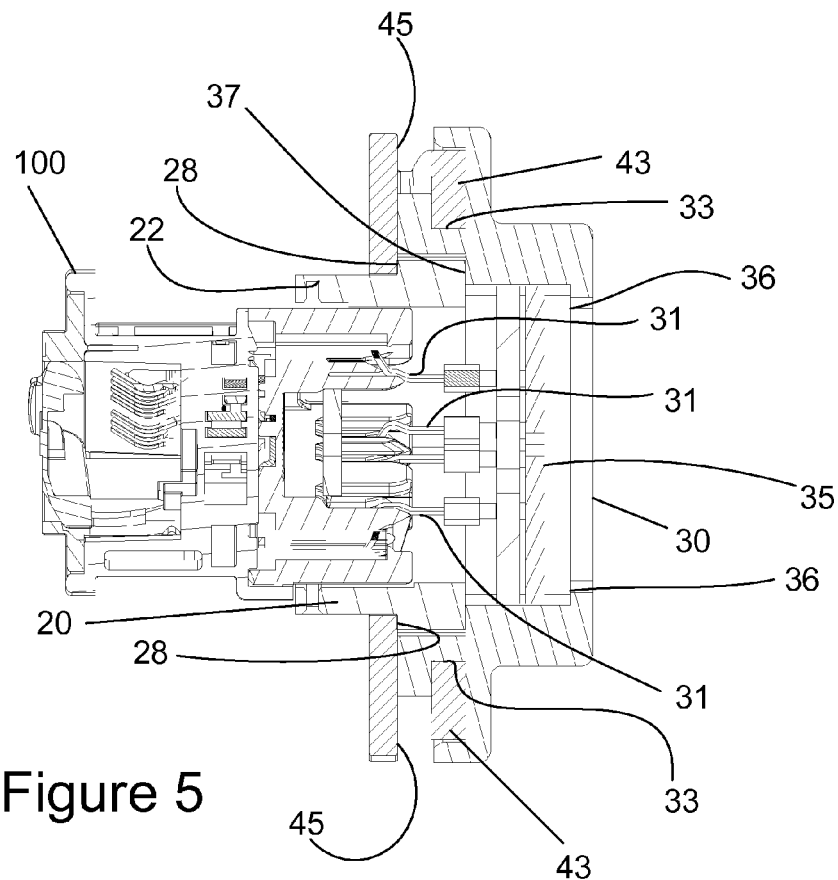
FIG. 5 is a section through the line 5-5 of FIG. 3.

Apparatus 10 also includes a base 30 for receiving a printed circuit board (PCB) 35 with which a plurality of transmission test probes 31 is in electrical communication. When the apparatus 10 is fully assembled (FIGS. 2 and 3), PCB 35 is received by and located within an aperture 38 in the base 30 (such that it is restrained against side-to-side movement by the internal walls of base 30) and rests against a seat 36, as best shown in the sectional views of FIGS. 4 and 5. The PCB 35 and probes 31 are preferably formed as separate components from the base 30 so that they can be replaced as necessary.

Each member of a pair of probes is insulated from its partner using insulating collar 32. When the apparatus 10 is in use, each probe 31 will be associated with one of the IDCs, as will later be described.

The apparatus 10 also features a locking mechanism for holding the jack holder 20 fixed relative to the base 30, such that the jack 100 remains stationary with respect to the probes 31. In this embodiment, the locking mechanism takes the form of a clip 40 which includes a plate-like portion 42 having a plurality of tongues 43 projecting from its lower surface. The tongues are shaped to engage with corresponding brackets 33 which project from the base 30.

To position the jack 100 for transmission testing, the jack 100 is inserted into the jack holder 20 by sliding ridge 104 into one of the grooves 22, such that the IDC slots 102 of the jack 100 straddle the central portion 26 (FIG. 2), and such that the jack 100 abuts against the stop 24 of jack holder 20.

Once the jack 100 is positioned in the jack holder 20, the shoulders 28 of jack holder 20 are aligned with guides in the form of recesses 39 of brackets 33 and the jack holder 20 is lowered into the cavity 38, towards PCB 35 which has previously been seated inside the base 30 in abutment with the seat 36. The recesses 39 face into the cavity 38 and accommodate the shoulders 28 of jack holder 20 such that it is restrained against side-to-side or rotational movement.

Figure 6:
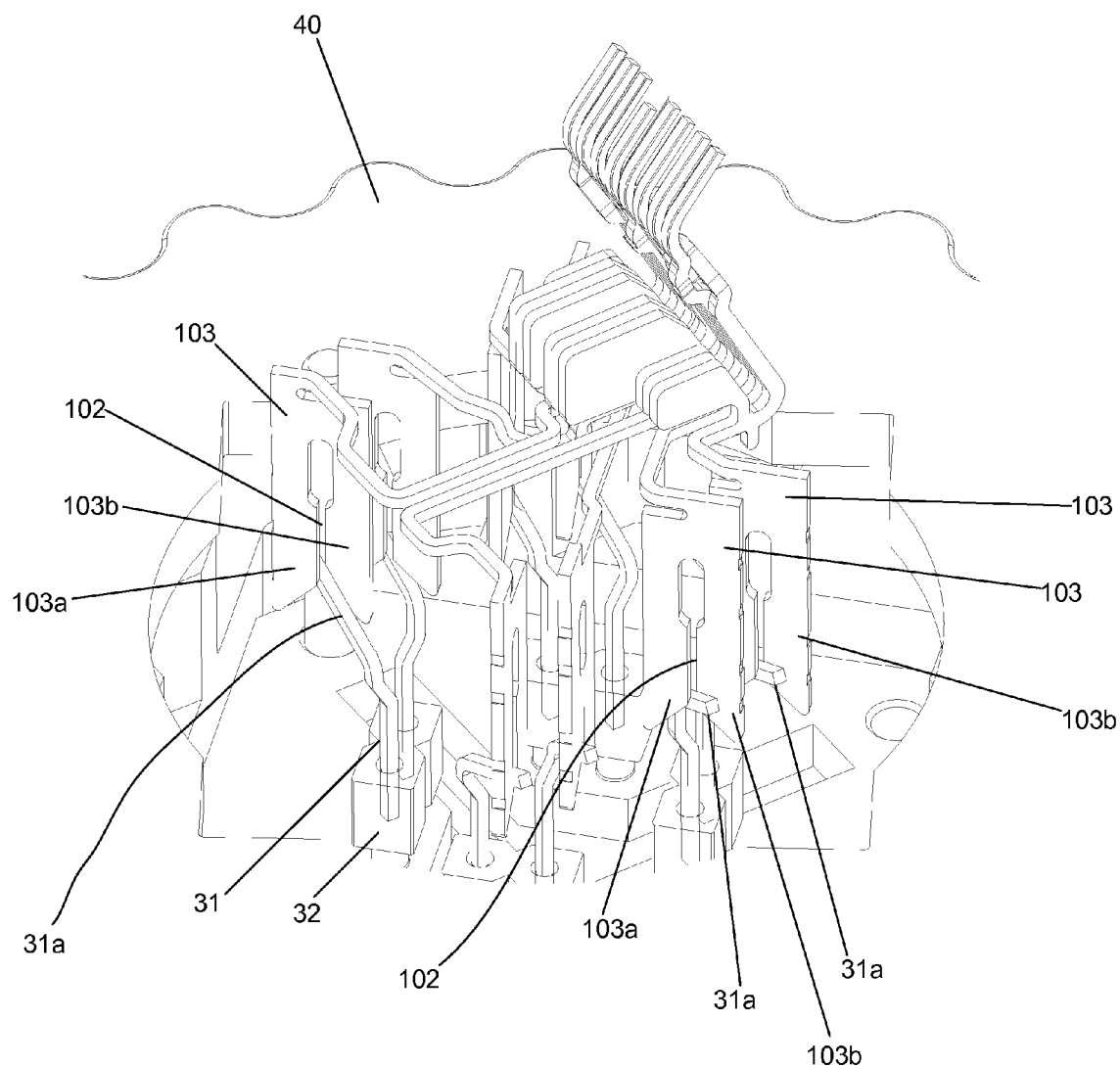
FIG. 6 is a partial cutaway view of the testing apparatus and jack of FIG. 2.

The probes 31 on PCB 35 are located such that, when the PCB 35 is seated in the base 30 and the shoulders 28 of jack holder 20 are located within brackets 33, the probes 31 align with the positions of IDC towers 101. This ensures that each probe 31 is aligned and associated with one of the IDCs 103, as shown in FIG. 6.

Each probe 31 has a contact portion in the form of a kinked or angled distal upper portion 31a which points away from the remainder (non-contact portion) of the probe. The angle of each upper portion 31a is chosen such that, if the upper portion 31a is not in alignment with the slot 102 as the jack holder 20 is lowered onto the probes 31, the angled upper portions 31a will come into contact with either of the blades 103a, 103b of the insulation displacement contacts 103 housed within IDC towers 101. The blades 103a, 103b have angled lower edges which form an angle of approximately 90 degrees therebetween so that as the jack holder 20 is pushed further down towards the probes 31, angled upper portions 31a will tend to slide along whichever of the blades 103a, 103b with which they are in contact such that the upper portion 31a will be trapped between the blades and be located within slot 102 of IDC 103. After the upper portion 31a has been located within the slot 102, further pressure can be applied such that the upper portion 31a can be bent for loading under tension. This is best shown in FIG. 6, in which the external housing of the jack 100 and the jack holder 20 are shown stripped away, so that only the IDCs 103 are visible. The angle between the upper portion 31a and the remainder of the probe 31 is preferably around 45 degrees or less in order to provide the required tension.

Once the jack holder 20 has been located in brackets 33, lowered onto the probes 31 and seated against surfaces 37 of the brackets 33, it can be locked to the base 30 using the clip 40. Clip 40 has a plate-like portion 42 with a lower surface 45 which is adapted to engage with the top surface of shoulders 28 of the jack holder 20. Thus, once the jack holder 20 is in position, the clip 40 is lowered over jack holder 20 so that jack holder 20 fits through aperture 44. Clip 40 is then rotated until tongues 43 engage with the brackets 33 on the base 30, at which point the lower surface 45 of clip 40 also engages with shoulders 28 of the jack holder 20, so that the base 30 and jack holder 20 are now held fixed relative to each other, thereby preventing any movement of the jack 100 relative to the probes 31.

In order to carry out a transmission test, the cover 110 of the restrained jack 100 may be flipped to expose the socket of the jack. A test plug connected to field testing equipment (not shown) may then be mated with the socket and a suitable battery of tests may be triggered by the field testing equipment. For example, in the case of a Category 6 (Cat 6) jack, tests may be run in accordance with Annexes D and E of ANSI/TIA/EIA/568-C.

Many modifications will be apparent to those skilled in the art without departing from the scope of the present invention.

Throughout this specification, unless the context requires otherwise, the word "comprise", and variations such as "comprises" and "comprising", will be understood to imply the inclusion of a stated integer or step or group of integers or steps but not the exclusion of any other integer or step or group of integers or steps.

The invention claimed is:

1. Apparatus for transmission testing of a telecommunications jack having a plurality of insulation displacement contacts (IDCs), the apparatus comprising:

a base supporting a circuit board and a plurality of transmission test probes in electrical communication with the circuit board of the base;

a jack holder for removably coupling the jack to the base such that IDCs of the jack are in electrical communication with the circuit board through corresponding test probes; and a locking mechanism including a clip for releasably coupling the jack to the base while the jack is seated in the jack holder such that the insulation displacement contacts of the jack are in electrical communication with corresponding ones of the test probes and such that the jack remains stationary with respect to the probes during testing, the clip defining an aperture through which a socket of the jack is accessible to a plug during testing.

2. The apparatus according to claim 1, wherein the jack holder is formed separately from the base.

3. The apparatus according to claim 2, wherein the base includes one or more guides for aligning the jack holder with the base and the test probes.

4. The apparatus according to claim 1, wherein the base includes a cavity to receive the printed circuit board which is in electrical communication with the test probes.

5. The apparatus according to claim 1, wherein the clip includes one or more tongues shaped to engage with corresponding brackets in or on the base.

6. The apparatus according to claim 1, wherein the clip includes a plate having a lower surface, and the jack holder includes one or more shoulders, wherein the plate is rotatable to bring the lower surface into engagement with the shoulders of the jack holder such that the jack remains stationary with respect to the probes.

7. The apparatus according to claim 1, wherein the jack holder includes at least one groove shaped to slidingly receive a ridge formed on an external surface of the jack, thereby to retain the jack.

8. The apparatus according to claim 1, wherein each probe has a contact portion which is bent at an angle to a non-contact portion of the probe.

9. A method of testing a plurality of telecommunications jacks using a testing device, each jack including a plurality of insulation displacement contacts (IDCs), the method comprising:

mounting a first one of the jacks into a jack holder by sliding the first jack in a first direction relative to the jack holder;

mounting the jack holder to a base by sliding the jack holder in a second direction relative to the base so that the insulation displacement contacts of the first jack contact test probes carried by the base, the second direction being transverse to the first direction;

mounting a clip to the base to lock the jack holder to the base, thereby holding the first jack stationary with respect to the probes.

10. A method according to claim 9, wherein the jack holder is formed separately from the base.

11. A method according to claim 10, wherein the probes are brought into contact with the IDCs after the jack is inserted into the jack holder.

12. A transmission testing device for testing a plurality of telecommunications jacks, each jack having a plurality of insulation displacement contacts (IDCs), the transmission testing device comprising:

a base supporting a circuit board and a plurality of transmission test probes in electrical communication with the circuit board of the base;

a jack holder configured to be detachably coupled to the base, the jack holder also being configured to detachably receive individual one of the jacks so that the jack holder holds only one of the jacks at a time, the jack holder being configured so that the IDCs of the jack being held are electrically connected to the test probes; and a locking clip configured to detachably mount to the base, the locking clip defining an aperture through which a socket of the jack being held is accessible, the locking clip being detachable from the base to enable detachment of the jack holder from the base so that the jack being held by the jack holder can be removed.

13. The testing device according to claim 12, wherein the jack holder is formed separately from the base.

14. The testing device according to claim 13, wherein the base includes one or more guides for aligning the jack holder with the base and the test probes.

15. The apparatus according to claim 12, wherein the clip includes one or more tongues shaped to engage with corresponding brackets in or on the base.

16. The apparatus according to claim 12, wherein the clip includes a plate having a lower surface, and the jack holder includes one or more shoulders, wherein the plate is rotatable to bring the lower surface into engagement with the shoulders of the jack holder such that the jack remains stationary with respect to the probes.

17. The apparatus according to claim 12, wherein the jack holder includes at least one groove shaped to slidingly receive a ridge formed on an external surface of the jack, thereby to retain the jack.

* * * * *